United States Patent
Wang et al.

(10) Patent No.: US 8,418,105 B1
(45) Date of Patent: Apr. 9, 2013

(54) METHODS FOR PATTERN MATCHING IN A DOUBLE PATTERNING TECHNOLOGY-COMPLIANT PHYSICAL DESIGN FLOW

(75) Inventors: Lynn T. Wang, Fremont, CA (US); Vito Dai, Santa Clara, CA (US); Luigi Capodieci, Santa Cruz, CA (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/349,412

(22) Filed: Jan. 12, 2012

(51) Int. Cl.
*G06F 17/50* (2006.01)
(52) U.S. Cl.
USPC .......................................................... 716/110
(58) Field of Classification Search .................. 716/100, 716/110
See application file for complete search history.

(56) References Cited

U.S. PATENT DOCUMENTS

| | | | |
|---|---|---|---|
| 7,861,196 B2 * | 12/2010 | Huckabay et al. | 716/136 |
| 8,151,219 B2 * | 4/2012 | Huckabay et al. | 716/50 |
| 2009/0199137 A1 * | 8/2009 | Huckabay et al. | 716/4 |
| 2010/0199253 A1 * | 8/2010 | Cheng et al. | 716/13 |
| 2011/0167397 A1 * | 7/2011 | Huckabay et al. | 716/112 |

OTHER PUBLICATIONS

Deng et al., "DPT Restricted Design Rules for Advanced Logic Applications," Optical Microlithography XXIV, Proc. of SPIE, vol. 79730H, Feb. 2011.
Teoh et al., "Pattern-Based Physical Verification in the Design Flow," Design for Automation Conference, Jun. 2011.
"Calibre InRoute—Signoff DRC Analysis and Automated Repair," Mentor Graphics, http://bit.ly/kQbFme, Jul. 2011.
"Virtuoso DFM," Cadence, http://www.cadence.com/products/cic/dfm/pages.default.aspx, Jul. 2011.

* cited by examiner

*Primary Examiner* — Suchin Parihar
(74) *Attorney, Agent, or Firm* — Ingrassia Fisher and Lorenz, P.C.

(57) ABSTRACT

A method for fabricating an integrated circuit is disclosed that includes, in accordance with an embodiment, providing a drawn layout logical design for the integrated circuit, the logical design including a plurality of patterns; checking the plurality of patterns for double patterning technology compliance; identifying a non-double patterning technology compliant pattern; providing a double patterning technology compliant pattern for replacing the identified non-double patterning technology compliant pattern, thereby creating a modified logical design; generating a mask set implementing the modified logical design; and employing the mask set to implement the modified logical design in and on a semiconductor substrate.

15 Claims, 6 Drawing Sheets

METHODS FOR PATTERN MATCHING IN A DOUBLE PATTERNING TECHNOLOGY-COMPLIANT PHYSICAL DESIGN FLOW

TECHNICAL FIELD

The present invention generally relates to methods for fabricating an integrated circuit, and more particularly relates to methods that include pattern matching in a double patterning technology-compliant physical design flow.

BACKGROUND

There is a continuing trend within the microelectronics industry to incorporate more circuitry having greater complexity on a single integrated circuit (IC) chip. Maintaining this trend generally entails shrinking the size of individual devices within the circuit by reducing the critical dimensions (CDs) of device elements along with the pitch, or the CD of such an element added to the spacing between elements. Microlithography tooling and processing techniques play an important role in resolving the features necessary to fabricate devices and accordingly, are continually under development to meet industry milestones relating to the CD and pitch characteristic of each new technology generation.

High numerical aperture (NA) projection stepper/scanner systems in combination with advanced photoresist processes now are capable of routinely resolving complex patterns that include isolated and dense resist features having CDs and pitches, respectively, well below the exposure wavelength. However, to meet the requirements of device design rules which continue to push the resolution limits of existing processes and tooling, other more specialized techniques have been developed to further enhance resolution. These include double patterning technology (DPT) techniques in which device patterns having potentially optically unresolvable features are decomposed into two or more complementary, and more easily resolvable patterns, each containing features with larger CDs and/or a relaxed pitch.

Generating high-volume, production-grade, DPT-compliant layout designs requires a significant change to the traditional physical design flow, in which layout designers use an iterative methodology to generate design rule check (DRC)-clean layouts to be processed by Mask Data Preparation (MDP). In the existing DPT-compliant design flow, layout designs are required to pass not only DRCs but also DPT-compliance checks. FIG. 1 depicts an existing DPT-compliant flow that includes additional rule-based checks for DPT-compliance. As shown therein, a drawn one-color layout (151) is checked for DRC and DPT compliance (153). If the design passes, an MDP-ready layout (two-color) is generated (152). If the design fails, an automated decomposition process (154) decomposes the design, and a post-decomposed layout is generated (155). Again, a DRC and DPT compliance check is performed (157), and if the design now passes, an MDP-ready layout (two-color) is generated (156). If the design again fails, a manual fix may be performed (158), and a modified layout generated (159), wherein the compliance checks are run again from step 153, as shown.

It will be appreciated that passing DPT-compliance checks often requires layouts to be decomposed (step 154). The decomposition process that includes cutting and stitching can be automated using state-of-the-art electronic design automation (EDA) decomposition tools. However, due to the complexity of mask-layer assignments, cuts, stitch-region generation, and design rule interactions, EDA tools cannot identify all possible decomposition solutions such that DPT-compliance check violations (i.e., failure at step 157) can be resolved automatically. For example, FIGS. 2a and 2b show spacing violations (marked by an "X") in non-decomposed layouts (parts 210 and 230) that must then be decomposed through manual decomposition (parts 220 and 240). Thus, layout designers are encumbered with fixing hundreds to thousands of DPT-compliant-check violations that need to be resolved through manual decomposition, cutting, and stitching.

BRIEF SUMMARY

Methods are provided for fabricating an integrated circuit. In accordance with one embodiment, a method includes providing a drawn layout logical design for the integrated circuit, the logical design including a plurality of patterns and checking the plurality of patterns for double patterning technology compliance. Once the design is compliance checked, the method may include identifying a non-double patterning technology compliant pattern and providing a double patterning technology compliant pattern for replacing the identified non-double patterning technology compliant pattern, thereby creating a modified logical design. After the modified logical design is created, the method may further include generating a mask set implementing the modified logical design and employing the mask set to implement the modified logical design in and on a semiconductor substrate.

In accordance with a further embodiment, a method includes identifying a double patterning technology compliance failure in a logical design for the integrated circuit and identifying a double patterning technology compliant pattern to replace the double patterning technology compliance failure in the logical design, wherein the compliant pattern is provided automatically without human intervention. After the compliant pattern is identified, the method may include replacing the compliance failure with the compliant pattern. Thereafter, the method may further include generating a mask set implementing the redesigned element and employing the mask set to implement the logical design in and on a semiconductor substrate.

In accordance with yet another embodiment, a method is provided for identifying a double patterning technology compliance failure in a logical design for the integrated circuit and matching the compliance failure with a double patterning technology compliant pattern selected from a library of double patterning technology compliant patterns. Once a match has been found, the method may include replacing the compliance failure with the compliant pattern.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

This disclosure presents a novel methodology employing a library of pre-characterized DPT-compliant patterns and a pattern matching engine that can be used to guide layout designers in resolving DPT-compliant check violations. As such, the methodology presented herein reduces the number of design cycle iterations in the physical design flow used to create double patterning technology (DPT)-compliant logical layout designs. The proposed methodology introduces a pattern matching module that can easily be integrated in the DPT-compliant design flow.

Figure 1:
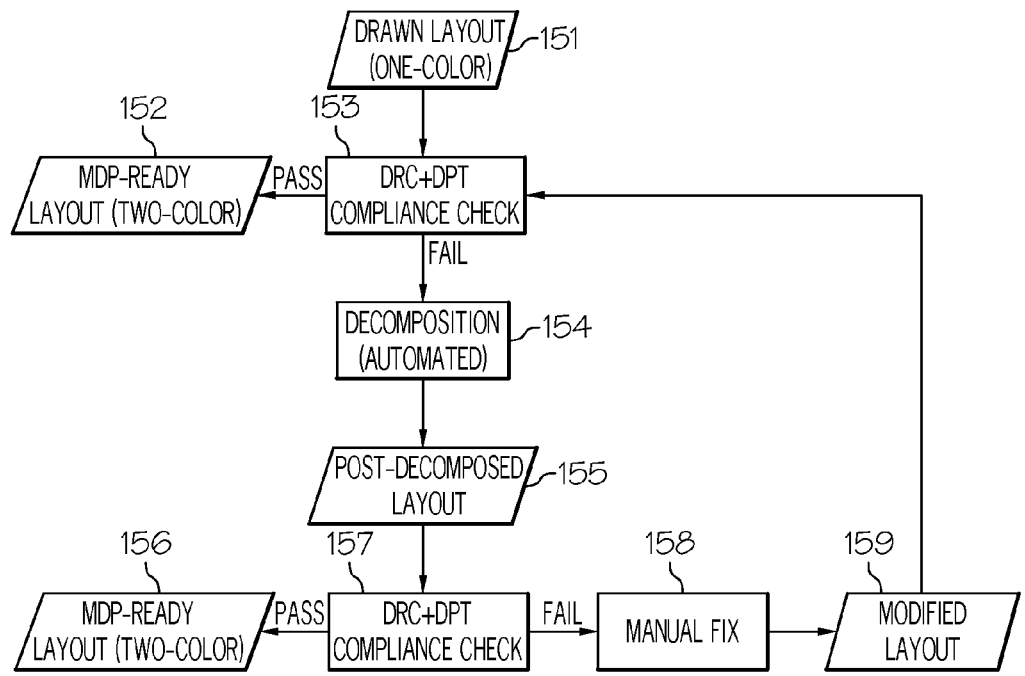
FIG. 1 depicts a flow diagram of existing procedures used in DPT-compliant design layouts.
Figure 2A:
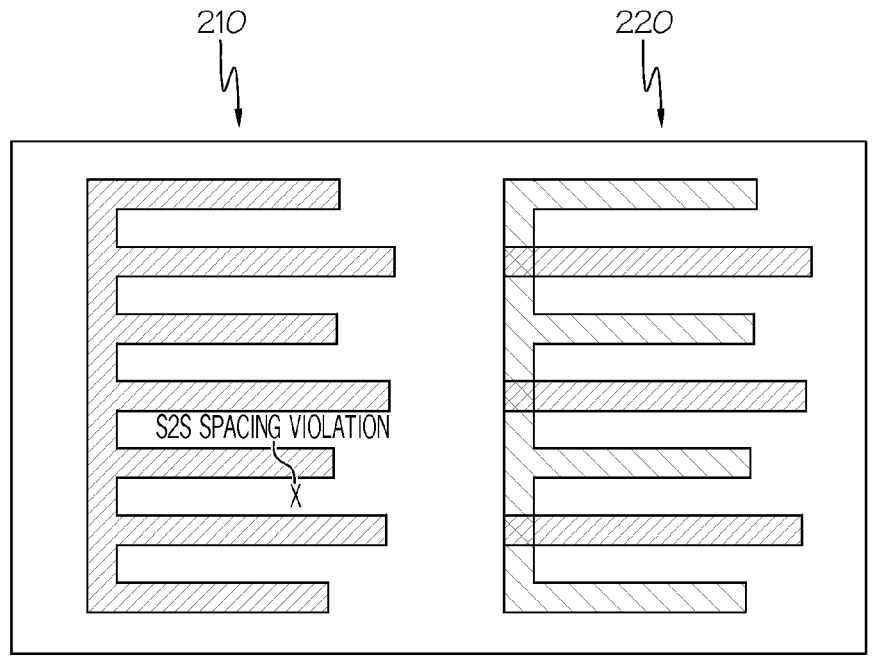
FIGS. 2a and 2b each depict schematically a drawn DPT layout design that cannot be decomposed using an automated decomposition tool such that the spacing violation is resolved versus their post manual decomposition solutions.
Figure 2B:
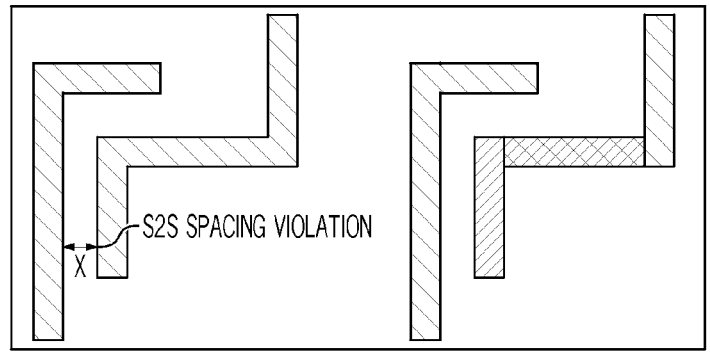
Figure 3:
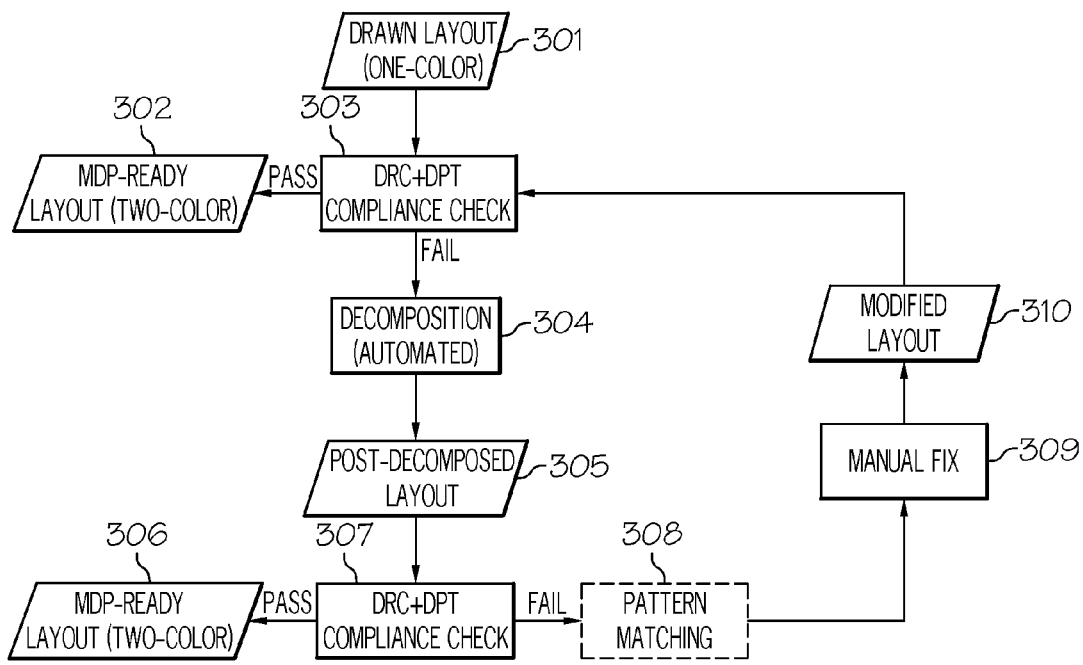
FIG. 3 depicts a flow diagram of a design flow procedure including pattern matching.

With reference now to FIG. 3, a novel DPT-compliant methodology integrates pattern matching with the existing DPT-compliant physical design flow, as described above with regard to FIG. 1. As shown in FIG. 3, the methodology proceeds in the manner of FIG. 1 for steps 301 through 307. However, in the event of a compliance failure at step 307 (post-decomposed layout), the pattern matching module is introduced at a step 308.

Figure 4:
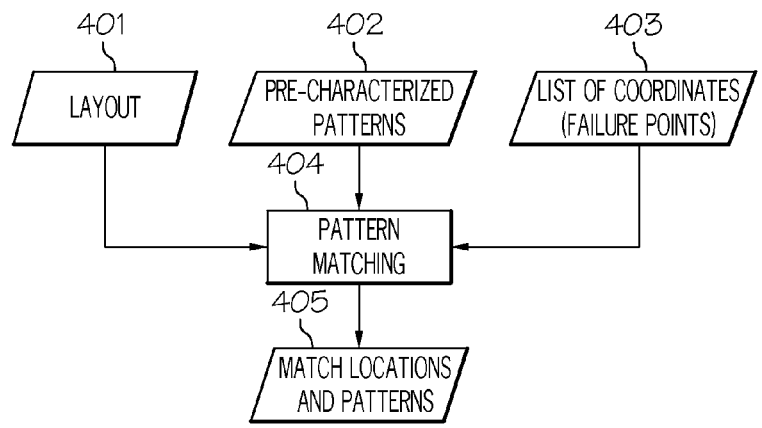
FIG. 4 depicts a flow diagram of the operation of a pattern matching module in accordance with the present disclosure.

The pattern matching module, in one embodiment as shown in FIG. 4, can use the following as inputs to its engine: the drawn layout design (401), the coordinates at which the DPT-compliant check violations occurred (403) (i.e., failure points, derived from step 307 of FIG. 3), and patterns from a pattern library (402). The pattern matching engine functions to scan the layout at the error locations for similarities with the pre-characterized patterns from the pattern library (404), which can be done automatically without human intervention. When a match is found, the engine outputs the match location and the corresponding DPT-compliant pattern(s) that resolves the violation(s) (405). Using the information provided by the pattern matching module as guidance, designers can manually fix the problematic locations in the layout. In addition or in the alternative, the fixing can also be automated since many EDA tools have already integrated pattern-based auto-fixing capabilities in their engines (see steps 309 and 310 from FIG. 3). The use of such EDA tools is contemplated to be within the scope of the present disclosure.

The pattern library can be generated in several manners. In one embodiment, the pattern library includes common, well-known DTP-compliant patterns that are known to resolve particular design layout failures. Such common patterns can be readily compiled and saved in the form of a pattern library. In another embodiment, the pattern library includes patterns that have been generated as a result of previous manual fixes to design layouts. That is, as designers resolve issues in DPT-compliant designs in the manner described above with regard to FIG. 1, the manual fixes employed at step 158 are identified, analyzed, and added to a pattern library. Of course, the pattern library can be populated with patterns generated in more than one manner.

Figure 5:
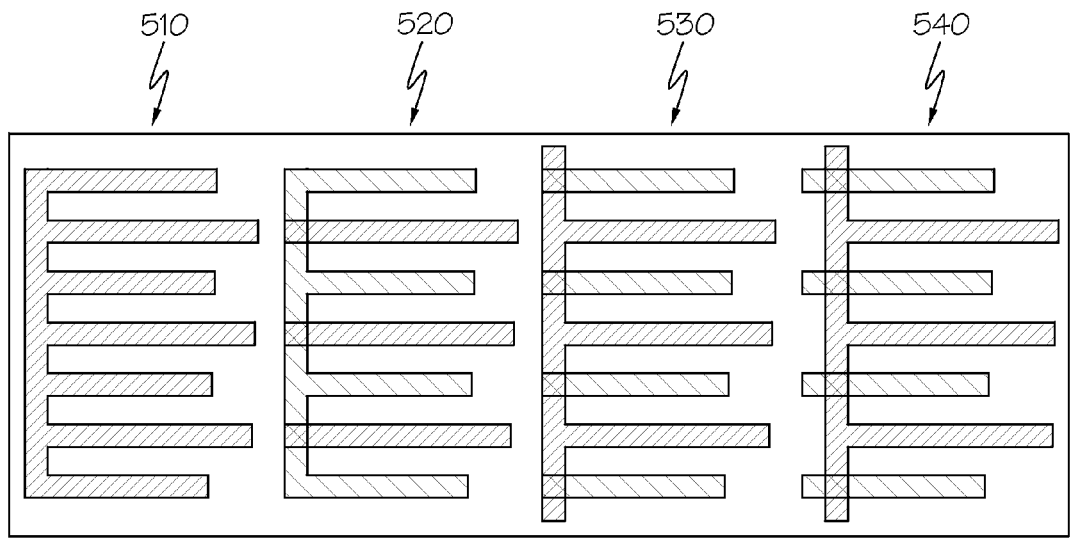
FIG. 5 depicts schematically alternative DPT layout designs illustrating design decompositions of various robustness.

In a further application of the presently described DPT-compliant design methodology, it will be appreciated that in many cases, multiple DPT-compliant patterns may exist for any given drawn layout, and minor changes in the drawn layout may increase the robustness of the layout to process variation (i.e., as may be encountered in IC chip fabrication). For instance, as shown in FIG. 5, extending the line-ends at which the two mask layers intersect increases the pattern's robustness to misalignment. The pattern matching module can be used to suggest multiple DPT-compliant patterns simultaneously. Part 510 of FIG. 5 presents an original drawn layout, and parts 520, 530, and 540 present DPT-compliant solutions for such layout in part 510. While part 520 preserves the original footprint of the drawn layout, the line-end extensions shown in parts 530 and 540 increase the pattern's robustness to misalignment in the y- and the x- and y-directions, respectively. The pattern matching module can output multiple DPT-compliant patterns and present them simultaneously to the designers. The designers can then decide which pattern to use. Alternatively, the pattern matching module can give preference to known preferred design solutions, as in parts 530 and/or 540 of FIG. 5.

Figure 6:
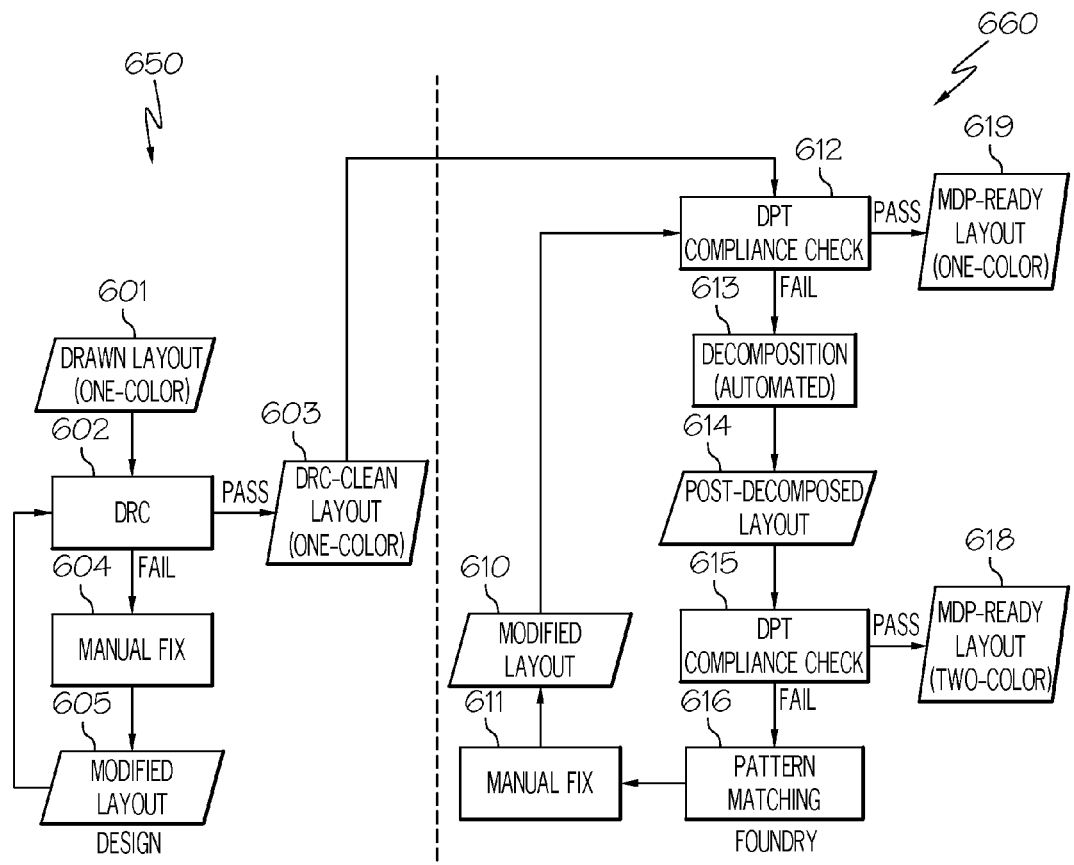
FIG. 6 depicts a flow diagram of a "transparent" design flow procedure including pattern matching.

In another embodiment, disclosed DPT-compliance pattern matching methodology can also be applied to "transparent" DPT-compliant physical design flows, meaning that in which decomposition does not occur until the layout designs have passed DRCs and been given to the foundry. In this manner, the DRC compliance checks and the DPT compliance checks are delegated to the designers and to the foundry, respectively. As shown in FIG. 6, a "transparent" design flow is segregated into two design flows. The first, part 650 of FIG. 6, includes steps 601 through 605, where a drawn layout 601 is DRC compliance checked by the designers (602). In the event of a compliance failure, a manual fix is employed (604) and a modified design is provided (605) and is again checked by the DRC at step 602. This process is iterated until a "clean" design that passes the DRC is achieved. The DRC-clean layout (603) is then sent to the foundry, where the second part of the design flow 660 is implemented. Part 660 of FIG. 6 includes steps 610 through 619 which are the same in all respects to steps 302 through 309 of FIG. 3, described above, except that the foundry only performs DPT compliance checks at steps 612 and/or 615.

Figure 7:
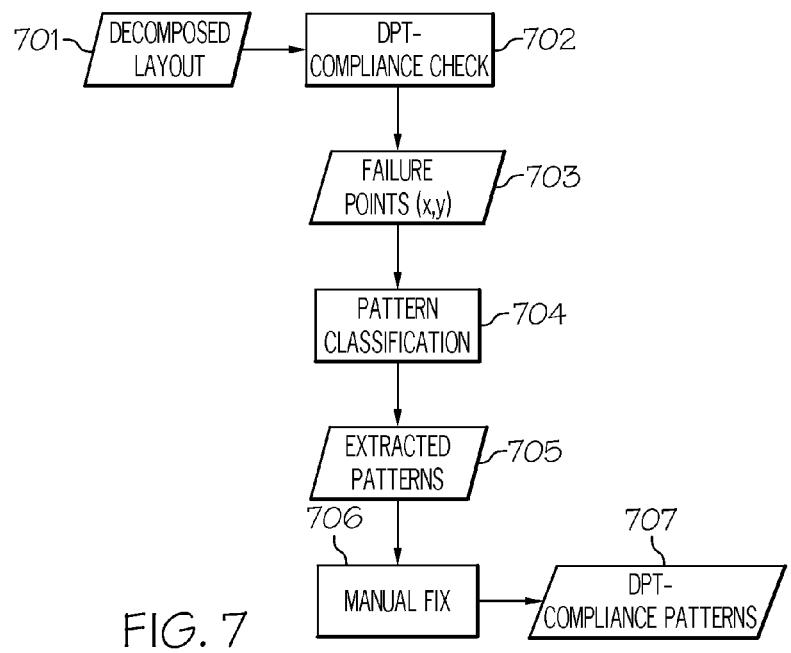
FIG. 7 depicts a flow diagram illustrating the generation of DPT-compliant patterns for a pattern library in accordance with the present disclosure.

As previously discussed, the pattern library can be generated through inclusion of well-known patterns and/or through in the inclusion of saved previous manual design fixes, for example. In some embodiments, a pattern classification engine may be used as part of the pattern library to populate the library with patterns based on manual fixes for use in the present methodology. An exemplary pattern generation flow is presented in FIG. 7. First, a decomposed layout is provided (701) that can be run through a DPT-compliance checker (702) to identify the locations where DPT-compliance checks were violated (i.e., failure points) in the decomposed layout. Then, the pattern classification engine uses the list of failure points (703) in the form of (x,y) coordinates and the decomposed layout as inputs. The engine scans the layout at the failure points and extracts the portions of the layout that constitute only unique pattern configurations (704). Then, for each extracted pattern (705), a DPT-compliant solution is provided via manual fixing (706) (i.e., decomposition, cutting, and stitching). Once the extracted pattern is made to be DPT-compliant, it is stored in the pattern library (707).

The number of patterns and the coverage of the pattern library increase as more layout designs are systematically created and tested. In this manner, a DPT-compliant library of sufficient coverage to anticipate potential DPT issues can be created.

Figure 8A:
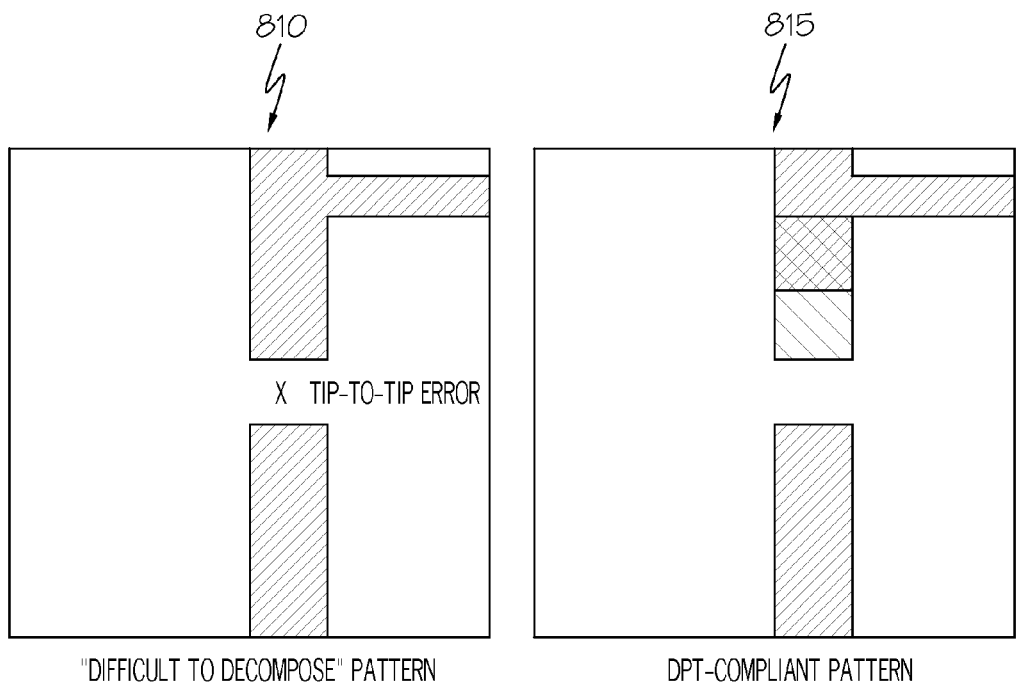
FIGS. 8a-c depict schematically exemplary DPT-compliant patterns for inclusion in a pattern library in accordance with the present disclosure.
Figure 8B:
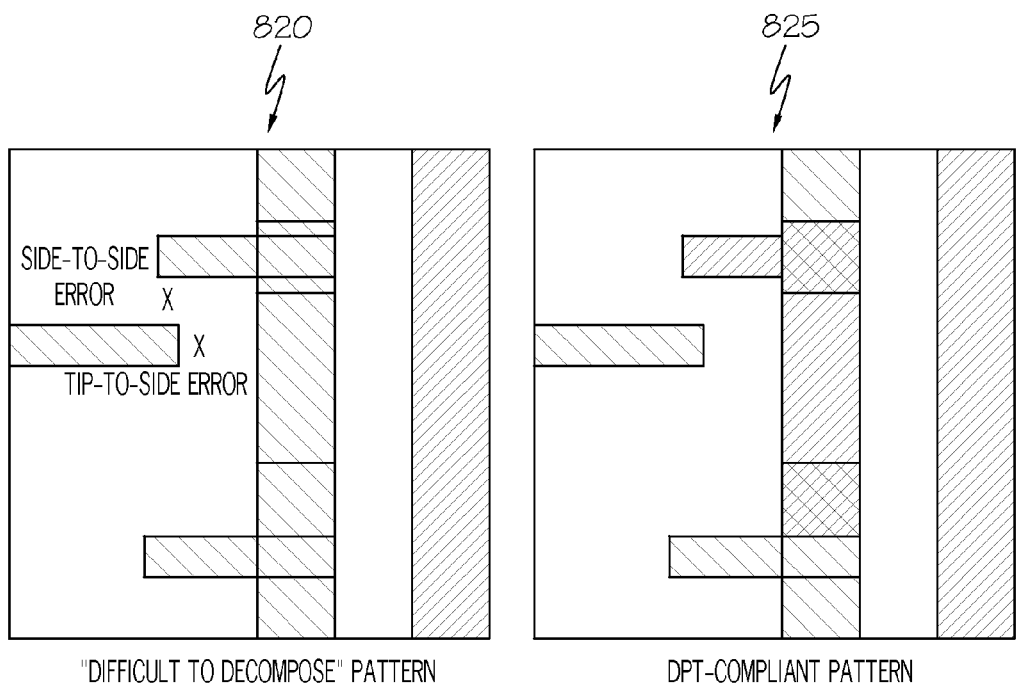
Figure 8C:
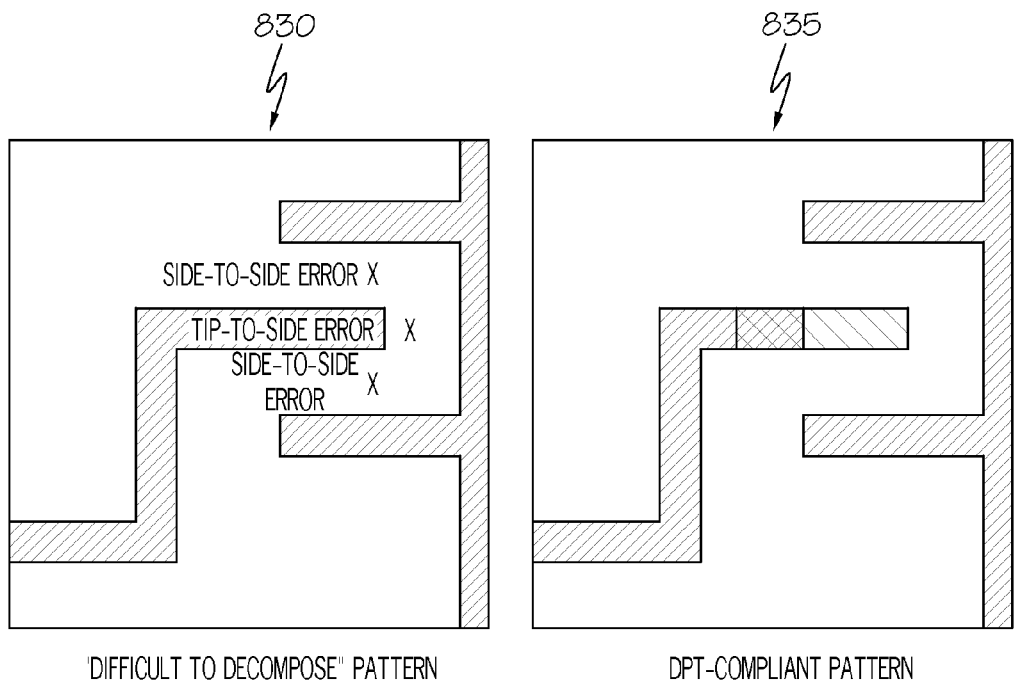

FIGS. 8a-c present exemplary patterns for inclusion in the pattern library that were based on manual fixes according to the procedures discussed above with regard to FIG. 7. Each of FIGS. 8a-c include a first part 810, 820, 830 illustrating an exemplary pattern that is "difficult to decompose," and is therefore subject to the procedures set forth in FIG. 7. For example, part 810 of FIG. 8a includes a tip-to-tip error marked by "X", part 820 of FIG. 8b includes both a side-to-side error and a tip-to-side error, each marked by "X", and part 830 of FIG. 8c includes two side-to-side errors and a tip-to-side error, each of which are marked by "X". Each of FIGS. 8a-c also include a second part 815, 825, and 835, illustrating exemplary manual fixes to the aforesaid errors ("DPT-compliant patterns"), as would be created in step 706 of FIG. 7. The errors are resolved by introducing an oppositely colored mask at the error points. These patterns 815, 825, and 835 can be saved into the pattern library, and can thereafter be suggested by the pattern matching module as possible fixes to DPT-compliance errors, as shown at step 308 of FIG. 3, or alternatively can be directly implemented using an EDA tool.

Figure 9:
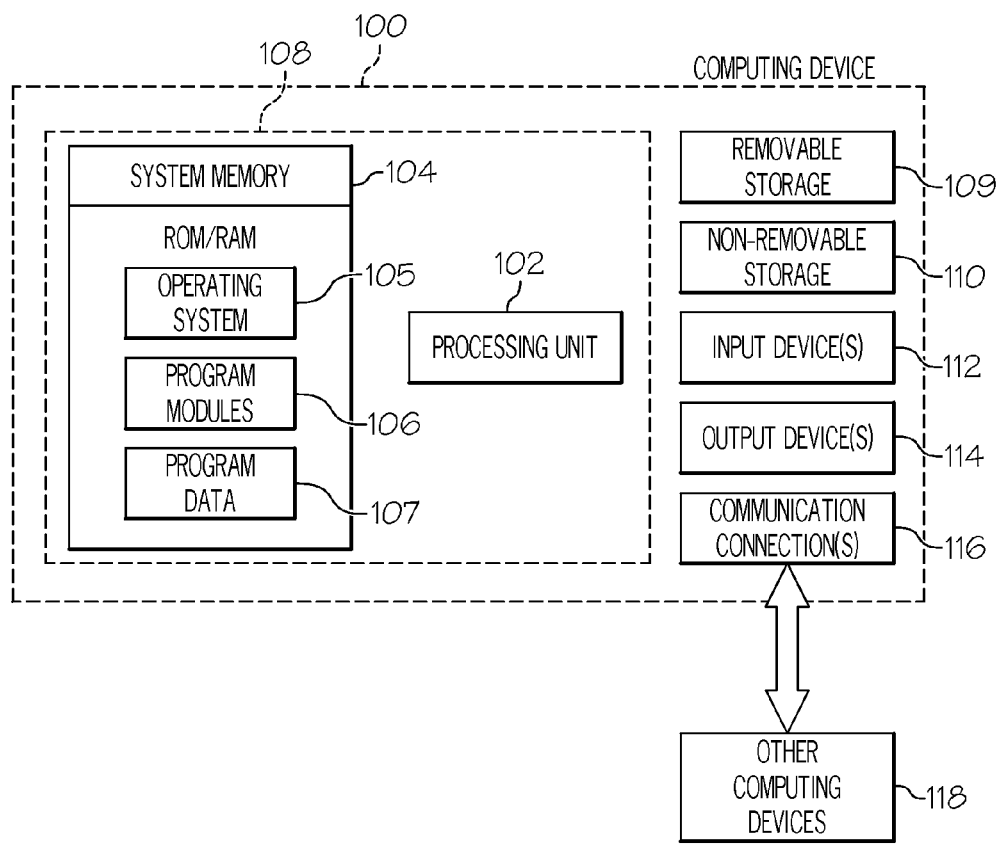
FIG. 9 is a functional block diagram that illustrates a computing device that may be used in implementations of the present invention.

The embodiments described herein can be implemented on a computing system. FIG. 9 is a functional block diagram that illustrates a computing device that may be used in implementations of the present invention. FIG. 9 illustrates an exemplary computing device that may be used in illustrative implementations of the present invention. With reference to FIG. 9, in a very basic configuration, computing device 100 typically includes at least one processing unit 102 and system memory 104. Depending on the exact configuration and type of computing device 100, system memory 104 may be volatile (such as RAM), non-volatile (such as ROM, flash memory, etc.) or some combination of the two. System memory 104 typically includes an operating system 105, one or more program modules 106, and may include program data 107. This basic configuration is illustrated in FIG. 9 by those components within dashed line 108.

Computing device 100 may have additional features or functionality. For example, computing device 100 may also include additional data storage devices (removable and/or non-removable) such as, for example, magnetic disks, optical disks, or tape. Such additional storage is illustrated in FIG. 9 by removable storage 109 and non-removable storage 110. Computer storage media may include volatile and nonvolatile, removable and non-removable media implemented in any method or technology for storage of information, such as computer readable instructions, data structures, program modules, or other data. System memory 104, removable storage 109 and non-removable storage 110 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 100. Any such computer storage media may be part of device 100. Computing device 100 may also have input device(s) 112 such as keyboard, mouse, pen, voice input device, touch input device, etc. Output device(s) 114 such as a display, speakers, printer, etc. may also be included. These devices are well known in the art and need not be discussed at length here.

Computing device 100 may also contain communication connections 116 that allow the device 100 to communicate with other computing devices 118, such as over a network. Communication connections 116 are one example of communication media. Communication media may typically be embodied by computer readable instructions, data structures, program modules, or other data in a modulated data signal, such as a carrier wave or other transport mechanism, and includes any information delivery media. The term computer readable media as used herein includes both storage media and communication media.

Embodiments of the present disclosure can be used to design logical IC chips capable of being fabricated using processes and apparatus known in the art. For example, once a layout design has been redesigned and finalized according to the methodology described above, the fabrication process can be accomplished by employing the mask set to fabricate the semiconductor device by implementing the logical design in and on a semiconductor substrate.

The presently disclosed embodiments will be appreciated to reduce design cycle iterations by providing DPT-compliant pattern-based solutions to guide design modifications such that DPT-compliant checks are met. Furthermore, the presently disclosed embodiments will be appreciated to increase yield and reduces costs of manufacturing by feeding forward process information to design.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
   providing a drawn layout logical design for the integrated circuit, the logical design including a plurality of patterns;
   checking the plurality of patterns for double patterning technology compliance;
   identifying a plurality of non-double patterning technology compliant patterns of the plurality of patterns;
   applying a computerized electronic design automation (EDA) decomposition tool to the plurality of non-double patterning technology compliant patterns, wherein after application of the EDA decomposition tool, a first subset of the plurality of non-double patterning technology compliant patterns are decomposed and a second subset of the plurality of non-double patterning technology compliant patterns are not decomposed;
   identifying the coordinate points of each pattern of the second subset of the plurality of non-double patterning technology compliant patterns that were not decomposed;
   using a computing system, automatically comparing the coordinate points of each pattern of the second subset against an electronic library of decomposed, double patterning technology compliant patterns, wherein the electronic library comprises a plurality of decomposed, double patterning technology compliant patterns that correspond to non-decomposed patterns that are not able to be decomposed automatically using the EDA decomposition tool;

based on the comparison, using the computing system, automatically providing a double patterning technology compliant pattern for replacing each of the identified non-double patterning technology compliant patterns of the second subset, thereby creating a modified logical design;

generating a mask set implementing the modified logical design; and employing the mask set to implement the modified logical design in and on a semiconductor substrate.

2. The method of claim 1, wherein the provided drawn layout logical design has been design rule compliance checked.

3. The method of claim 1, wherein identifying a non-double patterning technology compliant pattern includes identifying the x,y coordinates of such pattern.

4. The method of claim 1, wherein the selected pattern was created to resolve known design compliance failures.

5. The method of claim 1, wherein the selected pattern was created to resolve a previous design compliance failure.

6. The method of claim 1, wherein replacing the identified non-double patterning technology compliant pattern comprises manually selecting a compliant pattern.

7. The method of claim 1, wherein replacing the identified non-double patterning technology compliant pattern comprises automatically selecting a compliant pattern.

8. The method of claim 1, further comprising matching a double patterning technology compliant pattern with a non-double patterning technology compliant pattern.

9. The method of claim 8, wherein matching is done automatically without human intervention.

10. The method of claim 9, wherein matching includes scanning the layout logical design at the identified non-double patterning technology compliant pattern for similarities with pre-characterized patterns stored in a pattern library.

11. The method of claim 1, wherein the patterns of the second subset were not automatically decomposed using the EDA decomposition tool because the patterns were too complex or because other design rule interactions prevented the patterns from being automatically decomposed.

12. A method for fabricating an integrated circuit comprising:

providing a drawn layout logical design for the integrated circuit, the logical design including a plurality of patterns;

checking the plurality of patterns for double patterning technology compliance;

identifying a plurality of non-double patterning technology compliant patterns of the plurality of patterns;

applying a computerized electronic design automation (EDA) decomposition tool to the plurality of non-double patterning technology compliant patterns, wherein after application of the EDA decomposition tool, at least one of the plurality of non-double patterning technology compliant patterns has automatically been replaced with a double-patterning technology compliant pattern, thereby creating a first modified logical design;

re-checking the plurality of patterns in the first modified logical design for double patterning technology compliance;

identifying at least one non-double patterning technology compliant pattern of the first modified logical design, the at least one non-double patterning technology compliant pattern having not been decomposed by the EDA decomposition tool;

identifying the coordinate points of each pattern of the at least one non-double patterning technology compliant pattern that was not decomposed;

using a computing system, automatically comparing the coordinate points of the at least one non-double patterning technology compliant pattern against an electronic library of decomposed, double patterning technology compliant patterns;

based on the comparison, using the computing system, automatically providing a double patterning technology compliant pattern for replacing the identified at least one non-double patterning technology compliant pattern, thereby creating a second modified logical design;

generating a mask set implementing the second modified logical design; and employing the mask set to implement the second modified logical design in and on a semiconductor substrate.

13. A method for fabricating an integrated circuit comprising:

providing a drawn layout logical design for the integrated circuit, the logical design including a plurality of patterns;

checking the plurality of patterns for double patterning technology compliance;

identifying a plurality of non-double patterning technology compliant patterns of the plurality of patterns;

applying a computerized electronic design automation (EDA) decomposition tool to the plurality of non-double patterning technology compliant patterns, wherein after application of the EDA decomposition tool, a first subset of the plurality of non-double patterning technology compliant patterns are decomposed and a second subset of the plurality of non-double patterning technology compliant patterns are not decomposed;

identifying the coordinate points of each pattern of the second subset of the plurality of non-double patterning technology compliant patterns that were not decomposed;

using a computing system, automatically comparing the coordinate points of each pattern of the second subset against an electronic library of decomposed, double patterning technology compliant patterns;

based on the comparison, using the computing system, automatically providing at least two double patterning technology compliant patterns suitable for replacing each of the identified non-double patterning technology compliant patterns of the second subset, selecting one of the at least two double patterning technology compliant patterns for replacing each of the identified non-double patterning technology compliant patterns, thereby creating a modified logical design;

generating a mask set implementing the modified logical design; and employing the mask set to implement the modified logical design in and on a semiconductor substrate.

14. The method of claim 13, wherein the selected one of the at least two double patterning technology compliant patterns is selected as being relatively more robust as compared to an other of the at least two double pattering technology compliant patterns.

15. The method of claim 14, further comprising re-checking the modified logical design for double patterning technology compliance prior to generating the mask set implementing the modified logical design.

* * * * *